United States Patent
Mayer

(10) Patent No.: US 9,009,517 B2
(45) Date of Patent: Apr. 14, 2015

(54) EMBEDDED VOLTAGE REGULATOR TRACE

(75) Inventor: Albrecht Mayer, Deisenhofen (DE)

(73) Assignee: Infineon Technologies AG, Neubiberg (DE)

( * ) Notice: Subject to any disclaimer, the term of this patent is extended or adjusted under 35 U.S.C. 154(b) by 186 days.

(21) Appl. No.: 13/297,364

(22) Filed: Nov. 16, 2011

(65) Prior Publication Data

US 2013/0124901 A1 May 16, 2013

(51) Int. Cl.
*G06F 1/00* (2006.01)
*G06F 1/28* (2006.01)
*G06F 1/32* (2006.01)
*G06F 11/30* (2006.01)
*G01R 21/133* (2006.01)

(52) U.S. Cl.
CPC ............... *G06F 1/28* (2013.01); *G01R 21/133* (2013.01); *G06F 1/32* (2013.01); *G06F 11/3013* (2013.01); *G06F 11/3024* (2013.01); *G06F 11/3062* (2013.01)

(58) Field of Classification Search
CPC .................... G06F 2221/0737; G06F 11/3062; G06F 1/189; G06F 11/3466; G06F 2217/78; G06F 1/28
USPC .................................................. 713/300–340
See application file for complete search history.

(56) References Cited

U.S. PATENT DOCUMENTS

| | | | | |
|---|---|---|---|---|
| 4,553,082 A * | 11/1985 | Nesler | ............................ | 323/288 |
| 4,730,167 A * | 3/1988 | Beeken et al. | .................. | 330/10 |
| 4,734,771 A * | 3/1988 | Lendaro et al. | ............... | 348/730 |
| 4,792,899 A * | 12/1988 | Miller | ............................ | 323/317 |
| 5,557,557 A * | 9/1996 | Frantz et al. | .................... | 703/22 |
| 5,721,485 A * | 2/1998 | Hsu et al. | ....................... | 713/323 |
| 5,864,225 A * | 1/1999 | Bryson | ......................... | 323/268 |
| 5,978,902 A * | 11/1999 | Mann | ............................. | 712/227 |
| 6,131,074 A * | 10/2000 | Kawai | ........................... | 702/107 |
| 6,191,644 B1 * | 2/2001 | Srinath et al. | .................. | 327/539 |
| 6,940,233 B2 * | 9/2005 | Gray | .............................. | 315/276 |
| 7,064,529 B2 * | 6/2006 | Telecco | ......................... | 323/267 |
| 7,105,950 B2 * | 9/2006 | Bemat et al. | .................... | 307/52 |
| 7,171,159 B2 * | 1/2007 | Di Camillo et al. | ......... | 455/13.4 |
| 7,234,068 B2 * | 6/2007 | Nonogaki et al. | ............ | 713/340 |
| 7,290,246 B2 * | 10/2007 | Cyran et al. | ................... | 717/130 |
| 7,330,990 B2 * | 2/2008 | Sato et al. | ..................... | 713/340 |
| 7,506,216 B2 * | 3/2009 | Bose et al. | .................... | 714/47.1 |
| 7,555,666 B2 * | 6/2009 | Brundridge et al. | .......... | 713/340 |
| 7,802,241 B2 | 9/2010 | Roy et al. | | |
| 7,825,642 B1 * | 11/2010 | Young et al. | .................. | 323/224 |
| 7,847,436 B2 * | 12/2010 | Blackmond | .................... | 307/71 |
| 7,877,235 B2 | 1/2011 | McConnell et al. | | |
| 7,886,150 B2 * | 2/2011 | Stollon et al. | ................. | 713/171 |
| 8,086,882 B2 * | 12/2011 | Shah et al. | .................... | 713/320 |
| 8,258,872 B1 * | 9/2012 | Lazar et al. | ................... | 330/285 |
| 2004/0268159 A1 * | 12/2004 | Aasheim et al. | ............. | 713/300 |
| 2007/0220292 A1 | 9/2007 | Ishihara et al. | | |
| 2008/0122518 A1 * | 5/2008 | Besser et al. | .................. | 327/518 |

(Continued)

*Primary Examiner* — Paul R Myers
(74) *Attorney, Agent, or Firm* — Eschweiler & Associates, LLC

(57) ABSTRACT

One embodiment of the present invention relates to a power and trace profiling system. The system includes a microcontroller based device having a voltage regulator. Additionally, the microcontroller based device is configured to receive a supply power. A system analyzer is configured to receive power profiles from the power profiler and trace profiles from the system profiler. The system analyzer is configured to identify power reduction modifications based on the power profiles and the trace profiles.

16 Claims, 5 Drawing Sheets

(56) References Cited

U.S. PATENT DOCUMENTS

| | | | |
|---|---|---|---|
| 2009/0144587 A1* | 6/2009 | Barrenscheen et al. | 714/40 |
| 2009/0327784 A1 | 12/2009 | Shah et al. | |
| 2012/0084028 A1* | 4/2012 | Kumar et al. | 702/61 |
| 2012/0194146 A1* | 8/2012 | Longacre | 323/234 |

* cited by examiner

EMBEDDED VOLTAGE REGULATOR TRACE

BACKGROUND OF THE INVENTION

The increasing speed and complexity of circuitry implies a significant increase in power consumption. Further, power consumption can be a critical factor for some power sources, such as battery powered devices, automotive systems, and the like. Various techniques have been employed to reduce power consumption.

One technique to reduce power consumption involves manually identifying and replacing components with fewer components in order to reduce power consumption. This technique can be effective for relatively simple circuitry and systems, but becomes costly and time consuming for larger scale systems. Further, the manual replacement can introduce errors into the system.

Another technique to reduce power consumption is to employ various design techniques to mitigate power consumption. The design techniques can reduce power consumption by incorporating lower power consumption design techniques. However, this technique doesn't consider implementation and usage patterns and may not adequately reduce power.

Still another technique to reduce power consumption involves performing software system traces while monitoring an external power supply to a system. Microcontroller systems introduce additional complexities and power usage patterns. The current or power supplied to the system is monitored while a software trace is performed. This technique can identify time periods in which the entire system is consuming large amounts of power, but may not provide enough information to identify power reduction opportunities. Further, the measured power values are low pass filtered due to the presence of capacitors at the supply terminals. Thus, short periods of power consumption or spikes can be missed.

DETAILED DESCRIPTION OF THE INVENTION

Figure 1:
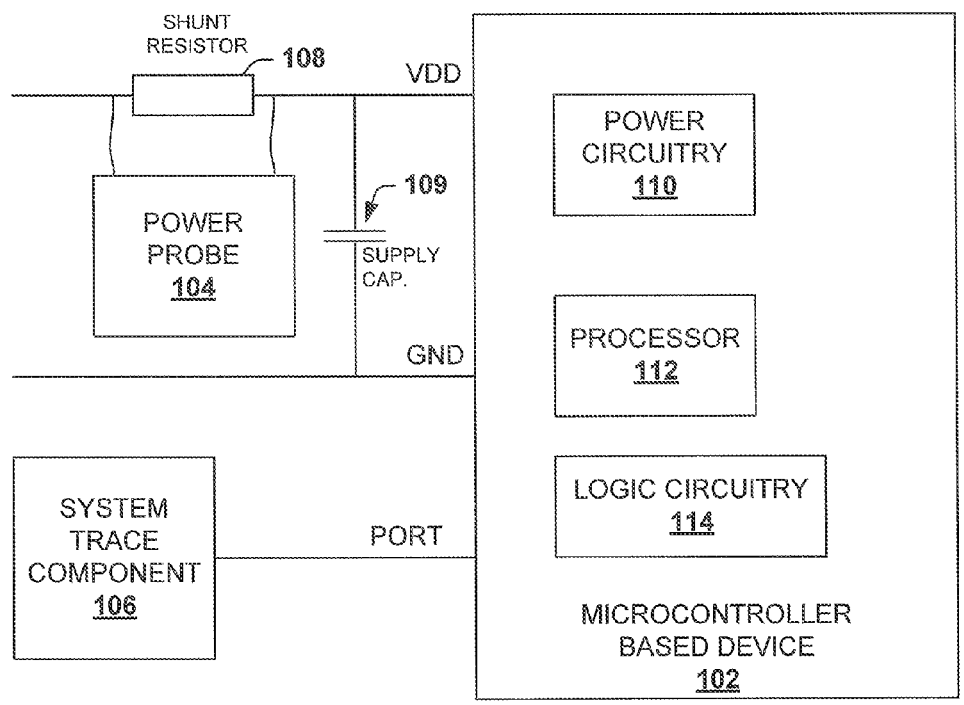
FIG. 1 is a block diagram illustrating a system for monitoring power consumption and tracing software.

The present invention will now be described with reference to the attached drawing figures, wherein like reference numerals are used to refer to like elements throughout, and wherein the illustrated structures and devices are not necessarily drawn to scale.

The present invention includes systems and methods for mitigating power consumption in microcontroller systems. System traces are performed while monitoring power consumption of internal system components, such as embedded voltage regulators. System traces generally involve logging or recording information about a program's execution by a microcontroller. The traces can follow program loops, memory accesses, firmware updates and the like. The traces are often employed for debugging and performance purposes. However, the traces can also be used in conjunction with monitoring power consumption of the internal system components. The internal component power consumption and traces are analyzed to identify and mitigate power consumption by the system.

Some aspects or embodiments of the present disclosure provide for a power and trace profiling system. The system includes a microcontroller based device having a voltage regulator. Additionally, the microcontroller based device is configured to receive a supply power. A system analyzer is configured to receive power profiles from the power profiler and trace profiles from the system profiler. The system analyzer is configured for allowing to identify power reduction modifications based on the correlated power profiles and the trace profiles. The power reduction modifications include software and hardware modifications. The power profiler can receive power measurements from other components within the device. The system can include other components a such as additional voltage regulators, processors, memory, logic/digital circuitry, analog circuitry, power circuitry, and the like. In an alternate embodiment, an external probe measures supply power to the device and provides external supply power measurements to the power profiler.

In another embodiment of the invention, a power and trace profiling system is disclosed. The system includes a power profiler, a system profiler, and a system analyzer. The power profiler receives power measurements from at least one voltage regulator of a microprocessor based device. The voltage regulator is internal to the device and can be an embedded voltage regulator. The system profiler receives system or software traces based on operations of the microcontroller based device. The traces can include information on various operations including, but not limited to, memory transfers, register values, instructions executed, variables, variable values, and the like. The system analyzer receives the power profiles and the trace profiles and correlates them. This correlation is either supported by time stamp information for the power measurement and the system trace. This approach works for independent transmission paths for each or a common path. Typically, the overhead for the time stamping and transmission is reduced by using a common path. The sequence of the data on this single path supports the correlation and allows reducing the overhead for time stamping. As a result, the system analyzer is operable to potentially identify power reduction modifications based on the power profiles and the trace profiles.

Yet another embodiment of the invention includes a method of performing power and trace profiler. An output power of a voltage regulator is measured to obtain power measurements over time. The power measurements can include current, voltage, power, and the like. The voltage regulator is internal to a microprocessor based device. System or software traces of executed code by the microprocessor are obtained in parallel or simultaneous with the power measurements. The traces include code instructions, variables, variable values, memory operations, register values, and the like. Power profiles are generated according to the power measurements. The power profiles can include multiple power measurements and are time stamped. It is also appreciated that the power measurements can include information from components other than voltage regulators, such as processors, digital circuits, analog circuits, and the like. Trace profiles are generated according to the system traces. The trace profiles include one or more software or system traces. Additionally, the trace profiles are time stamped or time correlated to facilitate analysis. The trace profiles and power profiles are compared at block to identify power reduction modifications according to the power profiles and the trace profiles. The power reduction modifications can include hardware and/or software modifications. For example, hardware components can be targeted for modification or replacement. As another example, software executed by the device can be modified to mitigate power consumption.

FIG. 1 is a block diagram illustrating a conventional system 100 for monitoring power consumption and tracing software. The system 100 includes a microcontroller based device 102, a power probe 104, and a system trace component 106.

The microcontroller based device 102 includes power circuitry 110, a processor 112, and logic circuitry 114. The power circuitry 110 modifies supply power VDD and provides internal power to other components, including the processor 112 and the logic circuitry 114. The processor 112 executes code to perform various tasks or functions. The logic circuitry 114 is controlled by the processor 112 in order to perform various logical operations.

The power probe 104 is coupled to an external power supply VDD and ground. The probe's 104 is connected across a shunt resistor 108 in order to obtain current measurements. A supply capacitor 109 is connected between the external power supply VDD and ground GND, which results in a low pass filter effect for the power probe 104.

The power probe 104 measures current across the shunt resistor 108 in order to determine power consumption at various points in time. Due to the filtering effect, the determined power consumption is an average power consumption value.

The system trace component 106 is coupled to a port on the microcontroller based device 102. The system trace component 106 obtains traces or logs based on the code executed by the processor 112. The traces can identify various events or function.

The system traces and the average power consumption can be analyzed to identify power reducing operations. However, the inventors of the present invention appreciate that the average power consumption may be insufficient to identify components within the device 102 to alter.

Figure 2:
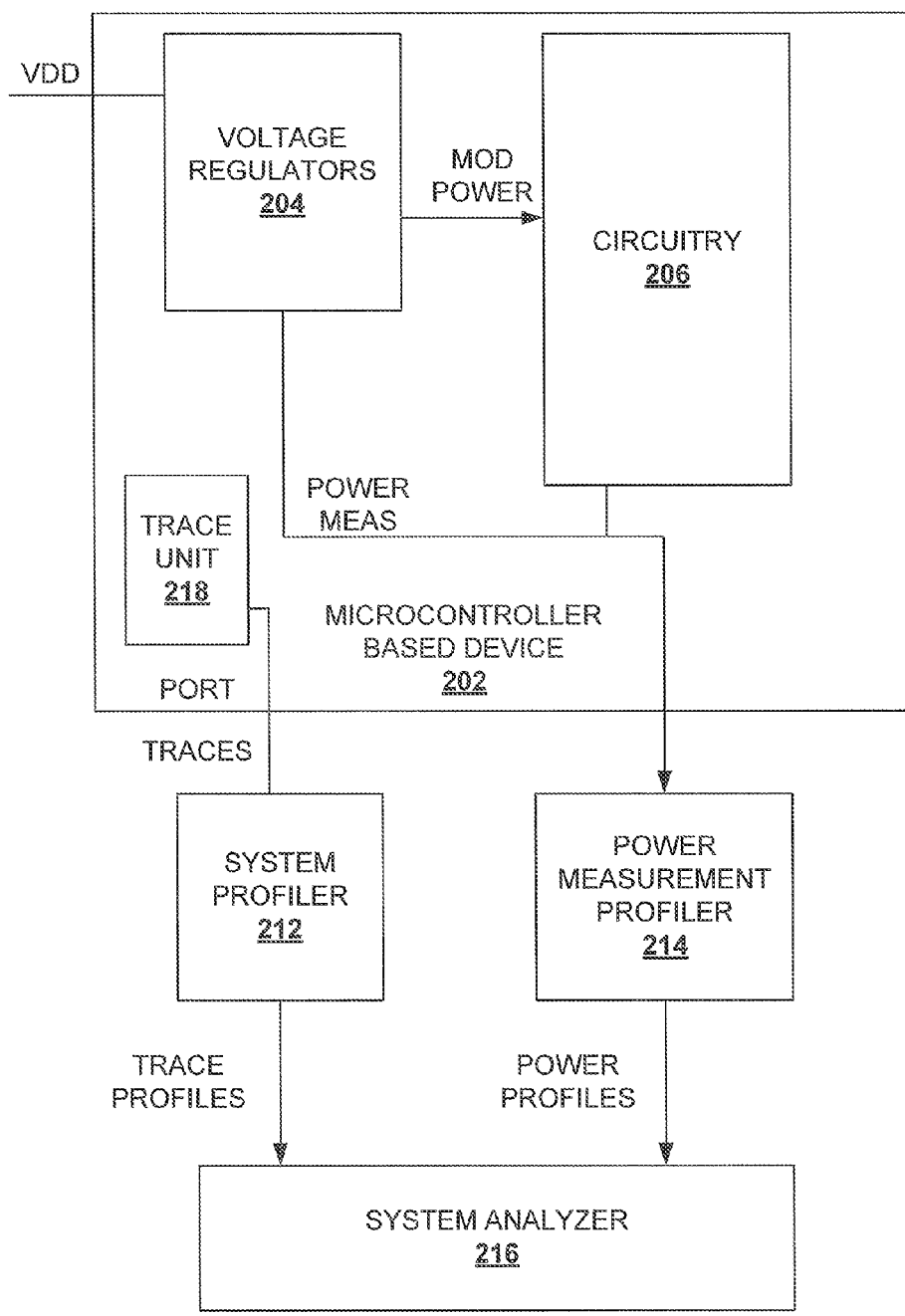
FIG. 2 is a block diagram illustrating a power and trace profiling system in accordance with an embodiment of the invention.

FIG. 2 is a block diagram illustrating a power and trace profiling system 200 in accordance with an embodiment of the invention.

The system 200 includes a microcontroller based device 202, a system profiler 212, a power profiler 214 and a system analyzer 216.

The microcontroller based device 202 includes one or more voltage regulators 204 and device circuitry 206. In one example, the voltage regulators include embedded voltage regulators (EVR). The voltage regulators 204 receive a supply power (VDD) and provide one or more modified power(s) (MOD POWER) to the circuitry 206. In one example, the supply power is at 12 volts and the modified power is at 5 volts. In another example, the supply power is at 10 Volts and the modified powers are at 5 volts and 3.3 volts. In another example, the modified powers are supplied at 5 volts, 3.3 volts, and 1-3 volts.

The voltage regulators 204 also provide power measurements on the output side of each regulator. The measurements can include current, power, resistance, voltage, representative signals, and the like. In one example, the power measurements include only current information and require power calculations based on assumed voltages. In other examples, the power measurements include current and voltage information. In yet other examples, the power measurements provide only power information.

The power measurements can be provided directly by the regulator or via a probe (not shown). The voltage regulators 204 may provide signals that correlate to power used. For example, resistance or pulse width modulation control signals for the voltage regulators 204 can be correlated to power consumption values for the voltage regulators 204. Additionally, the voltage regulators 204 may include output signals that indicate or correspond to current or power used. Probes can be used additionally or instead of built in measurements being provided by the regulators 204. The probes can include current or power monitoring circuits, shunt resistors, and the like. If the probes are in addition to built in measurement providers, the probe obtained measurements can be employed to compare with the regulator provided measurements.

The device circuitry 206, in addition to the voltage regulators 204, can optionally provide power measurements. The device circuitry 206 can include a variety of components, including but not limited to, power amplifiers, logic circuitry, memory devices, processors, and the like.

The system profiler 212 obtains software or system traces of operation of the device 202. The system traces generally involve logging or recording information about execution by a microcontroller or processor. The traces can follow program loops, memory accesses, exceptions, firmware updates and the like. The system profiler 212 generates trace profiles based on the system traces. The trace profiles include timing or time stamping information along with the traces. The trace profilers may include additional analysis or information such as cache hits/misses, bus conflicts, signal values, etc.

The power profiler 214 receives power measurements and generates power profiles. The power measurements include power related measurements for one or more internal components, including the voltage regulators 204 and the device circuitry 206. The power measurements are collected and provided as the power profiles. The power profiles include the power information with the timing or time stamping information to enable correlation and analysis with the system traces. It is noted that the system traces and the power measurements are typically obtained and provided simultaneously and stored and/or output as one common trace message stream The system analyzer 216 receives the trace profiles and the power profiles from the system profiler 212 and the power profiler 214, respectively. The combination of the trace profiles and the power profiles permits correlation of software operations and hardware operations because the trace and power profiles occur over substantially the same time period. This correlation permits analysis and identification of software executions that draw significant power. Further, the correlation permits and aids analysis of hardware operation during software sequences or segments.

As a result of the above, the system analyzer 216 is operable to determine energy consumption by analyzing the power and trace profiles and time considerations. Further, the system analyzer 216 is operable to identify power reduction modifications based on the trace profilers, the power profiles and/or energy consumption. The power reduction modifications include component replacement, suggested redesigns, and software program modifications that result in utilizing less power. Further, because the power profiles include information on internal components instead of an external power source, more power reductions can be identified than with conventional systems. For example, a power reduction modification could include setting a component to a power saving mode during certain operations or functions. The system analyzer 216 is operable to analyze power information at a high resolution, such as in μs, because the power measurements are provided from internal components of the device 202.

Figure 3:
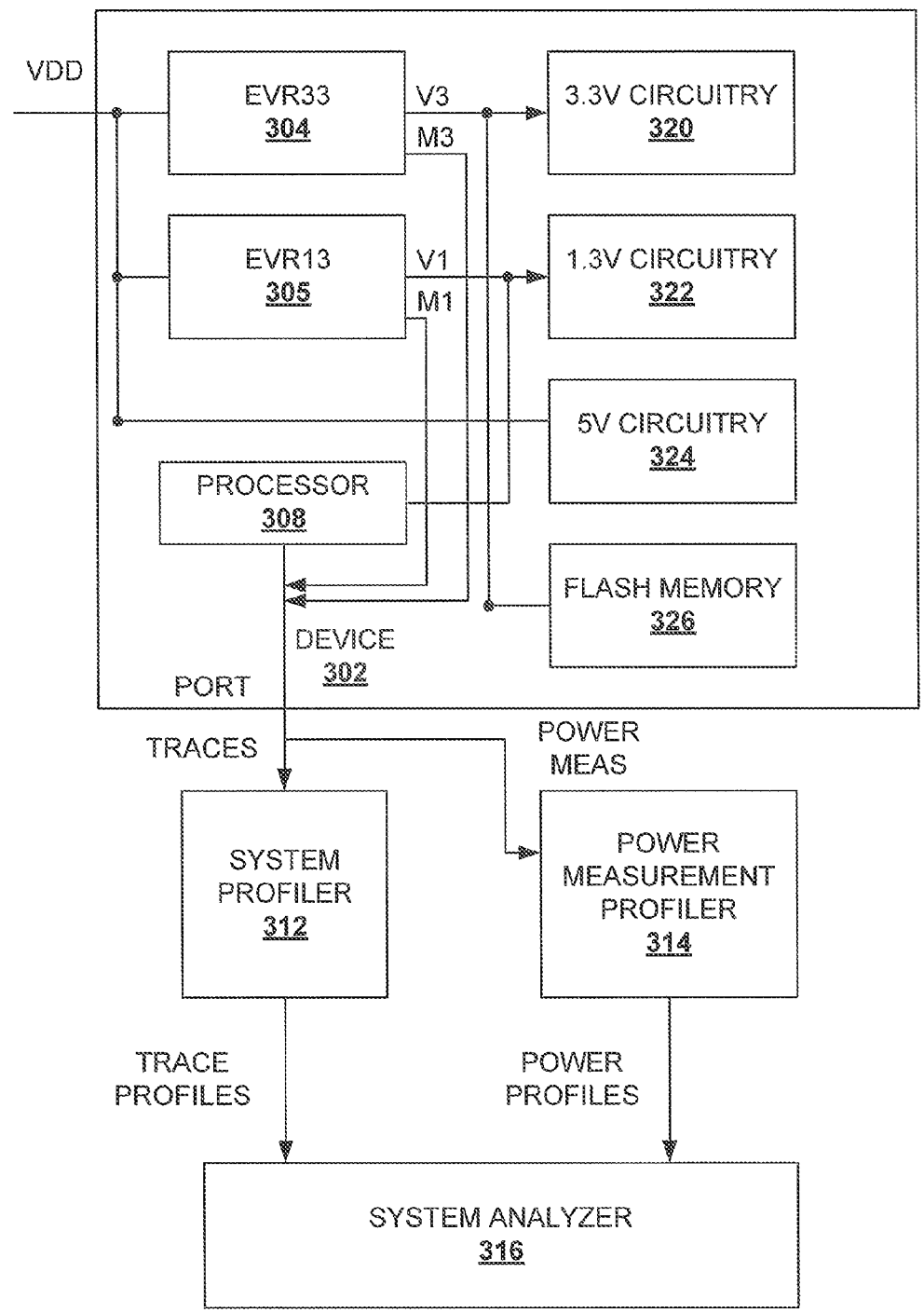
FIG. 3 is a block diagram illustrating a power and trace profiling system in accordance with an embodiment of the invention.

FIG. 3 is a block diagram illustrating a power and trace profiling system 300 in accordance with an embodiment of the invention. The system analyzes trace profiles and power measurement profiles to identify power reduction modifications. It is appreciated that data and other connections between components are not shown and/or simplified in order to illustrate the power connections between components.

The system 300 includes a microcontroller based device 302, a system profiler 312, a power profiler 314 and a system analyzer 316.

The device 302 is shown and described with particular components to facilitate understanding of the invention. However, it is appreciated that other components can be added and that some or all of the included components can be omitted from systems and still be in accordance with the invention.

The device 302 includes a first embedded voltage regulator 304, a second embedded voltage regulator 305, a processor 308, 3.3V circuitry 320, 1.3V circuitry 322, 5V circuitry 324 and flash memory 326.

The first embedded voltage regulator (EVR) 304 receives a supply voltage and provides an output voltage V3 and a measurement signal M3. The output voltage for this regulator 304 is 3.3 V. The measurement signal M3 provides a power measurement for the regulator 304.

The first embedded voltage regulator 304 can be selected to operate in one of several modes and output conditions. Some example modes and output conditions include, 3.3 V generated output mode, 5 V generated output mode, power saving mode, linear mode, switch regulator mode, low dropout mode, and the like. In one example, the regulator is selected to operating in a linear mode. In another example, the regulator 304 is selected to operate in a switch regulator mode. The switch regulator mode tends to be more efficient in that power is quickly turned on and off to yield the generated voltage. The duty cycle of off versus on, or a pulse width modulation signal, determines the output voltage for the generated voltage. The pulse width modulation signal (PWM) can be correlated to power consumption values for the regulator 304. The correlation can be improved by calibrating for die temperatures and the like. The linear mode typically utilizes a resistive network to select the output voltage for the generated voltage and dissipates unused power via resistors.

The regulator 304 also monitors supplied and generated voltages for over voltage conditions, under voltage conditions, supplied current, generated current and the like. The regulator 304 is also operable to provide information on the current mode of operation, reset conditions, and the like.

Furthermore, the regulator 304 includes one or more inputs for setting the modes and output conditions. In one example, a regulator input can be utilized to set the output voltage by a signal or resistance value.

The second embedded voltage regulator (EVR) 305 receives a supply voltage and provides an output voltage V1 and a measurement signal M1. The second regulator 305 can operate in a similar manner to the first regulator 304. However, the output voltage V1 and the measurement signal M1 can be varied from V3 and M3. The output voltage for this regulator 305, in one example, is 1.3 V. The measurement signal M3 provides a power measurement for the regulator 305.

The second embedded voltage regulator 305 can be selected to operate in one of several modes and output conditions. The modes and conditions can be varied from the modes and conditions selected for the first regulator 305. Some example modes and output conditions include, 3.3 V generated output mode, 1.3 V generated output mode, power saving mode, linear mode, switch regulator mode, low dropout mode, and the like. In one example, the regulator is selected to operating in a linear mode. In another example, the regulator 305 is selected to operate in a switch regulator mode. The switch regulator mode tends to be more efficient in that power is quickly turned on and off to yield the generated voltage. The duty cycle of off versus on determines the output voltage for the generated voltage. The linear mode typically utilizes a resistive network to select the output voltage for the generated voltage and dissipates unused power via resistors.

The regulator 305 also monitors supplied and generated voltages for over voltage conditions, under voltage conditions, supplied current, generated current and the like. The regulator 305 is also operable to provide information on the current mode of operation, reset conditions, and the like.

Furthermore, the regulator 305 includes one or more inputs for setting the modes and output conditions. In one example, a regulator input can be utilized to set the output voltage by a signal or resistance value.

The processor 308 is shown receiving supply voltage VDD, however it is appreciated that alternate embodiments can include one or more processors using supply voltages VDD and/or power from regulators, such as V3 or V1. The processor 308 executes program code and other types of code to perform various functions and operations of the device 302. The code for execution can be stored in a memory device, such as the flash memory 326.

The 3.3 V circuitry 320 generally operates at 3.3 V and receives power V3 in order to operate. The 3.3 V circuitry 320 can include logic circuits, analog devices, processors, and/or other types of circuitry to perform various functions for the device 302. The 3.3 V circuitry 320 can, in some examples, provide power measurements to the power measurement profiler 314. Some examples of 3.3 V circuitry 320 include fast I/O ports, sensor I/Fs, etc.

The 1.3 V circuitry 322 typically operates at 1.3 V and receives power V1 in order to operate. The 1.3 V circuitry 322 can include logic, analog devices, memory devices, processors, and/or other types of circuitry. Further, the 1.3 V circuitry can include a probe or other mechanisms in order to provide power measurements to the power measurement profiler 314. Some examples of 1.3 V circuitry 322 include the logic and the RAM parts of a typical microcontroller in 130 nm technology.

The 5 V circuitry 324 generally operates at about 5 V and receives supply power Vdd. The 5 V circuitry 324 can include logic devices, analog devices, memory devices, processors, and/or other types of circuitry. Additionally, the 5V circuitry can include a probe or other mechanisms to obtain and provide power measurements to the power measurement profiler 314. Some examples of 5 V circuitry 324 include GPIO (General Purpose IO) ports, ADC, sensor I/Fs, and the like.

The flash memory 326 is shown operating with the supply power V3. The flash memory 326 may internally include charge pumps in order to provide voltages for programming, erasing, and reading operations. Alternately, the flash memory 326 may receive power from other voltage regulators, such as regulator 305 and supply power VDD. The flash memory 326 is operable to provide power measurements to the power measurement profiler 314. The power measurements include power consumption for various operations including, but not limited to programming, reading, and erasing. The power measurements can be utilized to mitigate power consumption by the flash memory 326.

The system profiler 312 obtains software or system traces of operation of the device 302. The system traces generally involve logging or recording information about execution by the processor 308. The traces can follow program loops, memory accesses, exceptions, firmware updates and the like. The system profiler 312 generates trace profiles based on the system traces. The trace profiles include timing or time stamping information along with the traces.

The power profiler 314 receives power measurements and generates power profiles. The power measurements include power related measurements for one or more internal components, including the first regulator 304, the second regulator 305, circuitry 320, 322, 325, the flash memory 326, and the processor 308. The power measurements are collected and provided as the power profiles. The power profiles include the power information with the timing or time stamping information to enable correlation and analysis with the system traces. In an alternate embodiment, the power profiler 314 also obtains or calculates an absolute power consumption value for the device 302. In one example, the absolute power is measured by a probe coupled to an external power supply, such as shown in FIG. 1.

The system analyzer 316 receives the trace profiles and the power profiles from the system profiler 312 and the power profiler 314, respectively. The system analyzer 316 analyze both the trace profiles and the power profiles to identify power consumption for hardware components, power consumption for software components and operations, improper usage of power saving modes, under voltage failures, over voltage failures, unexpected power consumption, and the like. From these, the system analyzer 316 can identify power reduction modifications based on the trace profilers and the power profiles. The power reduction modifications include component replacement, suggested redesigns, and software program modifications that result in utilizing less power. Further, because the power profiles include information on internal components instead of an external power source, more power reductions can be identified than with conventional systems. For example, a power reduction modification could include setting a component to a power saving mode during certain operations or functions. The system analyzer 316 is further operable to identify component failures and the like.

Figure 4:
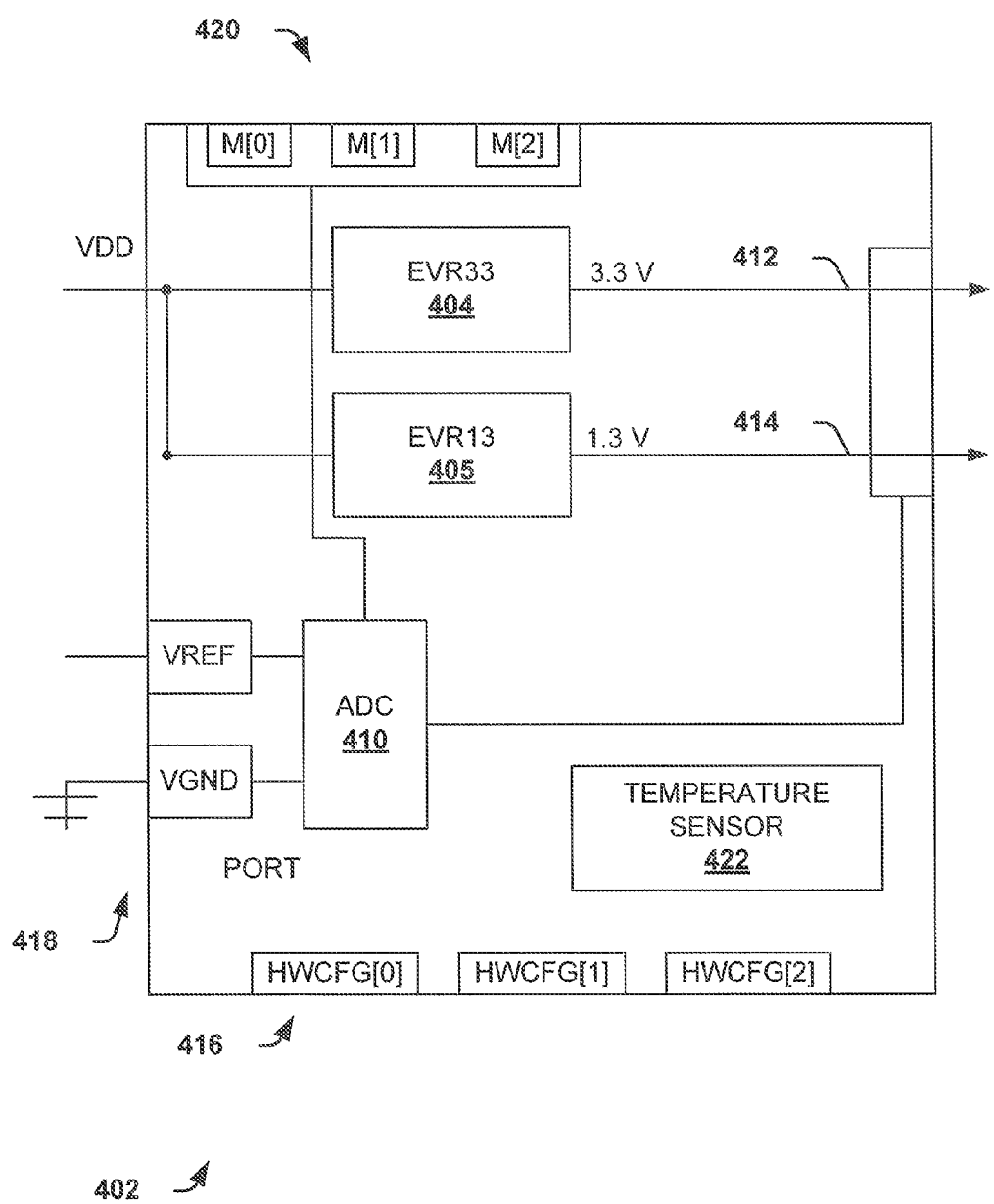
FIG. 4 is a diagram illustrating an embedded voltage regulator in accordance with an embodiment of the invention.

FIG. 4 is a diagram illustrating an embedded voltage regulator 402 in accordance with an embodiment of the invention. The regulator 402 can be utilized in system 300 for regulators 304 and 304 of FIG. 3 and in system 200 as regulators 204 of FIG. 2 and with alternate embodiments of the invention. The regulator 402 provides dual power outputs at first and second voltages. The first power output 412 is at 3.3 V and the second power output 414 is at 1.3 V. However, it is appreciated that alternate embodiments can include varied numbers of outputs and voltages.

The embedded voltage regulator 402 includes a first internal embedded voltage regulator 404, a second internal embedded voltage regulator 405, power inputs 418, configuration ports 416, power measurement ports 420, a temperature sensor 422, the first power output 412 and the second power output 414.

The power inputs 418 receive an external supply VDD, a reference voltage VREF and a ground connection VGND. The external supply VDD is at a suitable voltage, such as 3.3 V, and is provided to the internal regulators 404 and 405. The first internal regulator 404 provides output power at a first voltage. In this example, the first voltage is at 3.3 V. The second internal regulator 405 provides output power at a second voltage. In this example, the second voltage is at 1.3 V.

The analog to digital converter (ADC) 410 measures the first and second output powers 412 and 414 and provides measurement information to the power measurement ports 420. The ADC 410 can also measure power obtained at the power inputs 418 and provide the measurement information to the power measurement ports 420. In one example, the ADC 410 measures using 4 bits synchronous to a pulse width modulation (PWM). The ADC 410 measurements are also utilized to alter duty cycles and adjust or regulate the first and second output powers 412 and 414.

The configuration ports 416 are utilized to set various modes of operation and control the regulator 402. The configuration ports 416 can set and release power saving modes, switch regulation modes, linear modes, LDO modes, and the like. The configuration ports 416 can also be utilized to calibrate power measurements according to a temperature, obtained via the temperature sensor 422. Further, the configuration ports 416 can be used to set or adjust output voltages and/or other parameters for the first and second output powers 412 and 414.

The power measurement ports 420 provide power and power related measurements. The ports 420 provide power measurements for the first and second outputs 412 and 414, supply power VDD, power at inputs 418, and the like. These measurements can include voltage, current, and power measurements. They can optionally also provide under voltage indications, over voltage indications, mode status indications, and the like.

The regulator 420 is provided merely as a non-limiting example of regulators that can be utilized with the present invention. It is appreciated that other types of regulators can be used.

Figure 5:
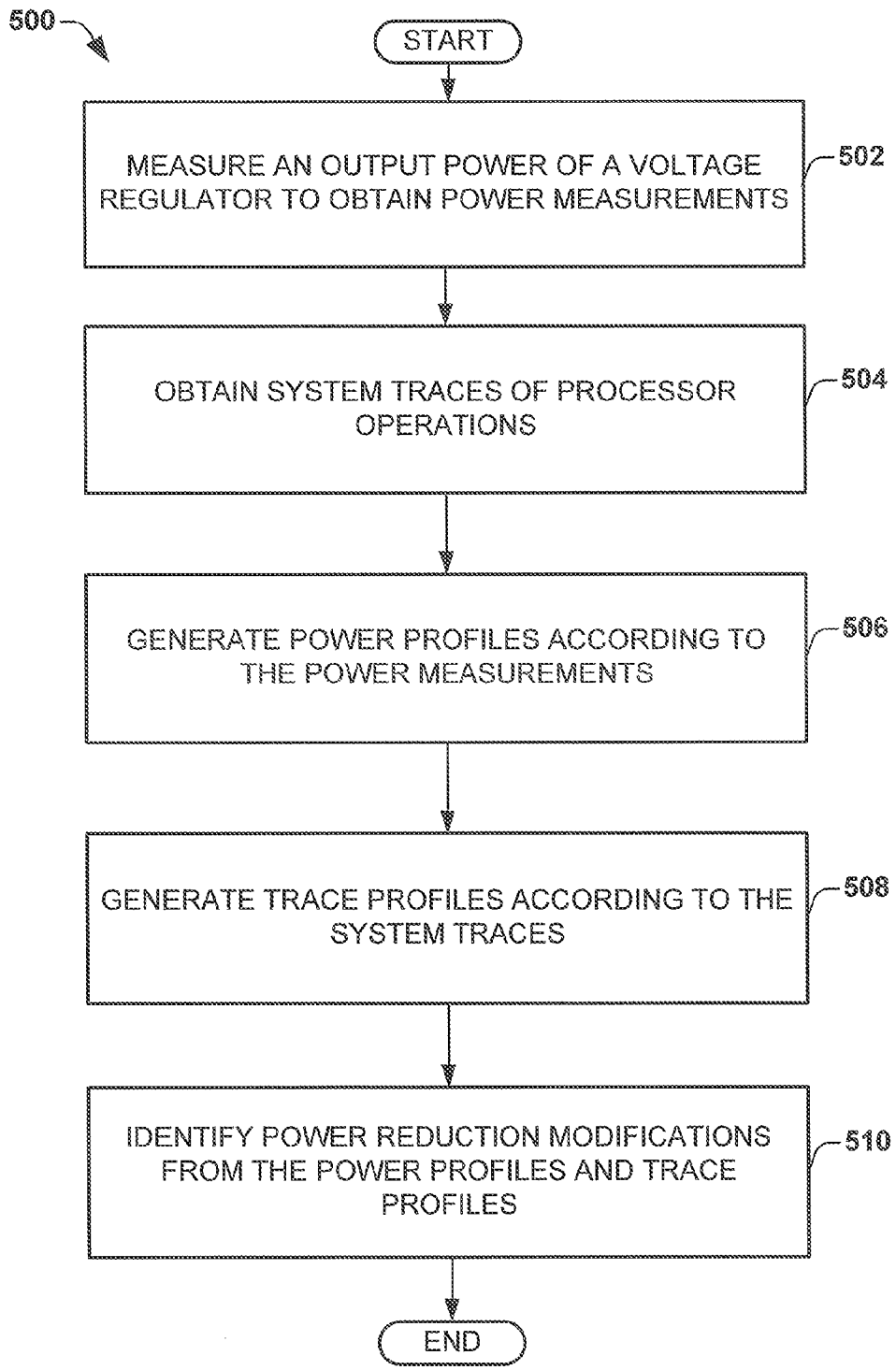
FIG. 5 illustrates a flow diagram of an exemplary method of performing power and trace profiling.

FIG. 5 illustrates a flow diagram of an exemplary method 500 of performing power and trace profiling. While method 500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

The method 500 begins at block 502, wherein an output power of a voltage regulator is measured to obtain power measurements over time. The voltage regulator can be an embedded voltage regulator in one example. The voltage regulator provides a regulated output power at a selected or designed voltage level. In one example, the output power is at 3.3 V. In another example, the output power is at 1.3 V. In yet another example, the voltage regulator provides multiple output powers at varied voltages. The voltage regulator receives a supply power, also referred to as VDD and generates the regulated output power via a suitable mechanism including, but not limited to, linear operation, switched regulation, and low dropout modes.

The power measurements can be maintained continuously or periodically. Further, the power measurements can be taken in response to an event or request. The power measurements include, but are not limited to, power related information. For example, the power measurements can include current, voltage, and the like measurements.

System traces of a processor or microprocessor are obtained at block 504. The system traces explain or log program or code executions by one or more processors. The traces can include register values, variables, variable values, memory operations, and the like.

Power profiles are generated according to the power measurements at block 506. The power profiles can include multiple power measurements and correlations with time. It is also appreciated that the power measurements can include information from components other than voltage regulators, such as processors, digital circuits, analog circuits, and the like.

Trace profiles are generated according to the system traces at block 508. The trace profiles include one or more software or system traces. Additionally, the trace profiles are time stamped or correlated to facilitate analysis.

The trace profiles and power profiles are compared at block 510 to identify power reduction modifications according to the power profiles and the trace profiles. The power reduction modifications can include hardware and/or software modifications. For example, hardware components can be targeted for modification or replacement. As another example, software executed by the device can be modified to mitigate power consumption.

Furthermore, the claimed subject matter may be implemented as a method, apparatus, or article of manufacture using standard programming and/or engineering techniques to produce software, firmware, hardware, or any combination thereof to control a computer to implement the disclosed subject matter (e.g., the circuits or systems shown in FIGS. 1, 2, etc., are non-limiting examples of circuits that may be used to implement method 500). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A power and trace profiling system comprising:
a microcontroller based device including a first voltage regulator, a second voltage regulator and an on-chip trace unit, the microcontroller based device configured to receive a supply power, the on chip-trace unit configured to provide program flow traces, the first voltage regulator configured to provide first power to first circuitry and the second voltage regulator configured to provide second power to second circuitry, the second power being at a level varied from the first power;
a power profiler configured to receive power information, wherein the power information includes first regulator information from the first voltage regulator, second regulator information from the second voltage regulator, first circuitry information from the first circuitry, and second circuitry information from the second circuitry;
a system profiler configured to receive the program flow traces on operation of the microcontroller based device;
wherein the first circuitry is logic circuitry and operates at a voltage lower than the second circuitry; and
wherein the power profiler correlates a pulse width modulation control signal for the first voltage regulator to obtain the first regulator information.

2. The system of claim 1, further comprising a system analyzer configured to receive power profiles from the power profiler and trace profiles from the system profiler.

3. The system of claim 2, wherein the system analyzer is further configured to identify power reduction modifications based on the power profiles and the trace profiles.

4. The system of claim 3, wherein the power reduction modifications include altering code used by the microcontroller device.

5. The system of claim 3, wherein the power reduction modifications include altering operation of the first voltage regulator and the second voltage regulator.

6. The system of claim 3, wherein the power reduction modifications include increasing usage of a power saving mode of the first voltage regulator.

7. The system of claim 1, wherein the first voltage regulator provides the first regulator information at an output side of the first voltage regulator.

8. The system of claim 1, the microcontroller device further comprising an on-chip measurement component to measure the current of the input or output power of the first voltage regulator and the second voltage regulator.

9. The system of claim 1, further comprising a power supply unit having a power trace generation component, the power trace generation component comprising an external probe to measure the supply power and to provide supply power measurements to the power profiler.

10. The system of claim 1, wherein the device further includes another voltage regulator configured to provide a modified power having a varied output voltage from an output power of the first voltage regulator and the second voltage regulator.

11. The system of claim 10, wherein the another voltage regulator provides additional power measurements to the power profiler.

12. The system of claim 1, wherein the first voltage regulator is an embedded voltage regulator.

13. A power and trace profiling system comprising:
a power profiler configured to receive power measurements including first regulator measurements from a first voltage regulator, second regulator measurements from a second voltage regulator, first circuitry measurements from a first circuitry and second circuitry measurements from a second circuitry of a microprocessor based device, wherein the first voltage regulator is configured to provide first power to first circuitry and the second voltage regulator is configured to provide second power to second circuitry, the second power being at a level varied from the first power;
a system profiler configured to receive system traces on operation of the microcontroller based device;
a system analyzer configured to receive power profiles from the power profiler and trace profiles from the system profiler and to identify power reduction modifications based on the power profiles and trace profiles;
wherein the first circuitry is logic circuitry and operates at a voltage lower than the second circuitry; and
wherein the power profiler correlates a pulse width modulation control signal for the first voltage regulator to obtain the first regulator information.

14. The system of claim 13, wherein the power profiles include power consumption over time.

15. The system of claim 13, wherein the power profiles include identified over and under voltage conditions.

16. The system of claim 13, wherein the trace profiles include code executed, register values, and memory operations and the trace profiles are time correlated with the power profiles.

* * * * *